United States Patent [19]

Kim et al.

[11] Patent Number: 5,627,089

[45] Date of Patent: May 6, 1997

[54] METHOD FOR FABRICATING A THIN FILM TRANSISTOR USING APCVD

[75] Inventors: Jeong H. Kim, Seoul; Eui Y. Oh, Kyungki-do, both of Rep. of Korea

[73] Assignee: Goldstar Co., Ltd., Seoul, Rep. of Korea

[21] Appl. No.: 281,926

[22] Filed: Jul. 28, 1994

[30] Foreign Application Priority Data

Aug. 2, 1993 [KR] Rep. of Korea .................. 14962/1993
Aug. 16, 1993 [KR] Rep. of Korea .................. 15805/1993
Sep. 3, 1993 [KR] Rep. of Korea .................. 17660/1993

[51] Int. Cl.$^6$ ......................... H01L 21/84; H01L 21/265
[52] U.S. Cl. ............................................................ 438/158
[58] Field of Search ............................. 437/21, 101, 41, 437/909, 187, 245, 246, 40, 238

[56] References Cited

U.S. PATENT DOCUMENTS

| | | | |
|---|---|---|---|
| 5,156,986 | 10/1992 | Wei et al. | 437/40 |
| 5,264,710 | 11/1993 | Yamagishi et al. | 257/2 |
| 5,273,920 | 12/1993 | Kwasnick et al. | 437/40 |
| 5,409,851 | 4/1995 | Oh | 437/41 |

OTHER PUBLICATIONS

Magarino et al., "Liquid Crystal Displays. II. Amorphous Silicon Active Matrix.", Revue Technique Thomson–CSF, Dec. 1986, vol. 18, No. 4, pp. 777–796.

Wolf et al., "Silicon Processing for the VLSI Era, vol. I", 1986, pp. 182–185.

Primary Examiner—John Niebling
Assistant Examiner—Richard A. Booth
Attorney, Agent, or Firm—John P. White

[57] ABSTRACT

This invention relates to a method for fabricating a thin film transistor used for LCD which can improve performance and productivity of an element by forming it with atmospheric pressure CVD method including processes for forming a gate electrode having sloped sides on an insulation substrate, forming a gate insulation film a semiconductor layer and a channel protection layer successively with atmospheric pressure chemical vapor deposition method on all over the insulation substrate, patterning the channel protection layer such that the channel protection layer is to have a narrower pattern width than the pattern width of the gate electrode remaining the channel protection layer only on the semiconductor layer over the gate electrode, forming an impurity injected semiconductor layer for making resistive contact by injecting impurities into the semiconductor layer using the channel protection layer as a mask, and forming source and drain electrodes over the channel protection layer, the impurity injected semiconductor layer and the gate insulation film so that upper surface of the channel protection layer between them can be exposed.

6 Claims, 10 Drawing Sheets

METHOD FOR FABRICATING A THIN FILM TRANSISTOR USING APCVD

FIELD OF THE INVENTION

This invention relates to a thin film transistor, more particularly to a method for fabricating hydrogen embrittled amorphous thin film transistors which can improve performance and productivity of elements by forming the semiconductor layers with atmospheric pressure chemical vapor deposition method.

BACKGROUND OF THE INVENTION

Thin film transistors are elements widely used for switching elements of liquid crystal displays, wherein a thin film transistor switches a liquid crystal display by controlling current flowing between the source/drain according to the voltage applied to the gate electrode.

A thin film transistor mostly uses polycrystal silicon film or amorphous silicon film for the semiconductor layer, and for resistive contact i.e., ohmic contact between the semiconductor layer and the source/drain electrodes, a semiconductor layer having impurity ions injected therein is provided between the semiconductor layer and the source/drain regions.

FIGS. 1(a) to 1(f) show conventional processes for fabricating a staggered, hydrogen embrittled amorphous thin film transistor.

A first metal film is deposited on a cleaned glass substrate 1, which is subjected to a patterning with photoetching process to form source/drain electrodes 2 and 3 as shown in FIG. 1(a).

For ohmic contact, a semiconductor layer 6 serving as an active layer is formed over the source/drain electrodes 2 and 3 by forming a high density n+ type amorphous silicon film doped with phosphor (n+a-Si) 4 on the exposed surfaces of the patterned source/drain electrodes 2 and 3 as shown in FIG. 1(b), depositing a hydrogen embrittled amorphous silicon (a-Si:H) film 5 on all over the using a PECVD (plasma Enhanced Chemical Vapor Deposition) equipment as shown in FIG. 1(c), and patterning the hydrogen embrittled amorphous silicon film (FIG. 1(d)).

Then, finally a conventional staggered thin film transistor can be formed by forming a gate insulation film 7 on all over the surface (FIG. 1(e)), forming a second metal film on the gate insulation film 7, and carrying out patterning of the second metal film with a photoetching process to form a gate electrode 8 on the gate insulation film 7 over the active layer 6(FIG. 1(f)).

However, in the foregoing conventional method for fabricating a thin film transistor, the active layer 6 has been formed by depositing a hydrogen embrittled amorphous silicon using a PECVD equipment at a temperature lower than that of the gate insulation film 7, i.e., the forming temperature of the gate insulation film 7 is higher than that of the active layer 6.

Therefore, in the process for forming the gate insulation film at a higher temperature, there has been a limit of temperature due to escape of hydrogens from the active layer 6. Accordingly, there has been a problem of deterioration of the element characteristics due to the difficulty in forming a gate insulation film of good quality and the deterioration of the interface between the gate insulation film and the active layer.

FIGS. 2(a) to 2(f) show conventional processed for forming a hydrogen embrittled amorphous silicon thin film transistor having single gate insulation film.

As shown in FIG. 2(a), first a gate electrode 12 is formed by forming a first metal film for a gate using a sputter equipment on a cleaned glass substrate 11 and carrying out patterning of the first metal film with a photoetching process.

Then, as shown in FIG. 2(b), a gate insulation film 13 is formed on all over the glass substrate having the gate electrode 12 formed thereon with PECVD method or RPCVD (Remote Plasma Chemical Vapor Deposition) method.

That is, with plasma discharge under the atmosphere of $SiH_4$, $NH_3$, and $H_2$ gasses at an appropriately controlled flow ratio, a silicon nitride (SiNx) film can be formed.

As shown in FIG. 2(c), a hydrogen embrittled amorphous semiconductor layer (a-Si:H) 14 is formed using $SiH_4$ and $H_2$ gas with PECVD method the same with the method for forming the gate insulation film 13 on the gate insulation film 13, and on which semiconductor layer 14 an impurity injected amorphous semiconductor layer 15 is formed.

As shown in FIG. 2(d), the impurity injected amorphous semiconductor layer 15 and the hydrogen embrittled amorphous semiconductor layer 14 formed by plasma in PECVD or RPCVD method are subjected to a patterning to form their width greater or the same with the width of the gate electrode 12.

As shown in FIG. 2(e), source and drain electrodes 16 and 17 are formed by depositing a second metal film on all over the substrate using a sputter equipment, which is subjected to a patterning to a prefixed pattern with a photoetching process.

In this instant, the second metal film is patterned such that parts 18 of the gate electrode 12 are positioned directly over the source and drain electrodes 16 and 17. As shown in FIG. 2(f), the exposed, impurity injected amorphous semiconductor layer 15 between the source and the drain electrodes 16 and 17 is removed selectively with dry etching method to form a channel of a thin film transistor.

With the foregoing process, the hydrogen embrittled amorphous semiconductor layer 14 can be exposed between the source/drain electrodes 16 and 17 over the gate electrode 12.

FIG. 3 is a section of a conventional thin film transistor having a channel protection layer.

The conventional thin film transistor having a channel protection layer includes, as shown in FIG. 3, a single gate insulation film 23 formed on all over a glass substrate 21 so as to cover a gate electrode 22, a semiconductor layer 24 having a wider pattern width than the gate electrode 22 formed on the gate insulation film 23, a channel protection layer 25 having a narrower pattern width than the gate electrode 22 formed on the semiconductor layer 24 directly over the gate electrode 22, an impurity injected semiconductor layer 26 for making ohmic contact formed on the semiconductor layer 24 so as to cover the channel protection layer 25 except central part of the upper side of the channel protection layer 25, and a source electrode 27 and a drain electrode 28 formed so as to expose the semiconductor layer 24 between them.

The processes for fabricating the foregoing conventional thin film transistor is to be explained hereinafter, referring to FIGS. 4(a) to 4(e).

First, as shown in FIG. 4(a), the gate electrode 22 is formed by depositing a metal layer of, such as Cr, Mo, Al and Ta with sputtering method on the cleaned glass substrate 21 and carrying out a photoetching process.

Then, as shown in FIG. 4(b), the gate insulation film 23, the semiconductor layer 24 and the channel protection layer 25 are deposited successively with PECVD method.

Herein, for the gate insulation layer 23, an SiNx:H film formed using $SiH_4$, $NH_3$, $N_2$ and $H_2$ gases is used mostly, for the semiconductor layer 24, an a-Si:H film formed using SiH4 and H2 gases is used mostly, and for the channel protection layer 25, an SiNx:H film deposited using $SiH_4$, $NH_3$, $N_2$ and $H_2$ gases is used mostly.

As shown in FIG. 4(c), patterning is carried out so that the pattern width of the channel protection layer 25 is narrower than the pattern width of the gate electrode 22.

After carrying out the patterning of the channel protection layer 25, an impurity injected semiconductor layer 26 for making ohmic contact, a resistive contact, between the semiconductor layer 24 and source/drain electrodes to be formed in following process, is formed on all over the substrate with PECVD method using $SiH_4$ and $PH_3$ gases.

As shown in FIG. 4(d), by carrying out patterning of the impurity injected semiconductor layer 26 and the semiconductor layer 24 such that the pattern widths of theirs are to be greater than that of the gate electrode 22, and, as shown in FIG. 4(e), by carrying out a metal layer deposition on all over the substrate and photoetching of it, a source electrode 27 and a drain electrode 28 can be formed.

Finally, a conventional thin film transistor can be completed by exposing the semiconductor layer 24 through etching of the impurity injected semiconductor layer 26 formed on the channel protection layer 25 between the source electrode 27 and the drain electrode 28 with dry etching process.

FIG. 5 is a schematic drawing of a PECVD equipment for forming a conventional gate insulation film or a conventional amorphous semiconductor layer film.

Referring to FIG. 5, an amorphous semiconductor deposition equipment includes a reaction furnace 41, an upper electrode 42 mounted on upper side of the reaction furnace 41, a lower electrode 43 mounted at lower side of the reaction furnace 41 opposite to the upper electrode 42 for putting wafers 44 thereon for processing, a high frequency generation power source 45 for applying high frequency voltage to the upper electrode 42, a pumping equipment 46 for maintaining the reaction furnace 41 at vacuum or discharge gas therefrom, and a gas injection part for injecting reaction gases and dilution gases into the reaction furnace 41.

The gas injection part includes a silane gas pipe 49-1 having an MFC (Mass Flow Controller) 47-1 and a shut off valve 48-1 for injecting silane ($SiH_4$) gas into the reaction furnace 41, a hydrogen gas pipe 49-2 having a MFC 47-2 and a shut off valve 48-2 for injecting hydrogen ($H_2$) gas into the reaction furnace 41, and a nitrogen gas pipe 49-3 having an MFC 47-3 and a shut off valve 48-3 for injecting nitrogen ($N_2$) gas into the reaction furnace 41.

The method for forming an amorphous semiconductor film using the foregoing equipment is, at first, to put a wafer (or a sample substrate) 44 on the lower electrode 43 in the reaction furnace 41, produce high vacuum in the reaction furnace 41 by operating the pumping equipment 46, and maintain the pressure in the reaction furnace constant by injecting silane ($SiH_4$) gas and nitrogen (or hydrogen) gas in an appropriate flow ratio into the reaction furnace 41.

In this instant, when the temperature at the lower electrode 43 becomes constant, high frequency voltage is applied to the upper electrode 42.

The plasma formed between the two, upper and lower, electrodes 42 and 43 by the high frequency voltage applied to the upper electrode 42 makes the silane ($SiH_4$) gas to decompose depositing ions on the wafer 44 under non-thermal equilibrium to form an amorphous semiconductor film thereon.

To obtain a hydrogen embrittled amorphous silicon film from above process, hydrogen, instead of nitrogen, should be injected into the reaction furnace 41 together with silane ($SiH_4$) gas.

However, with the conventional method for fabricating a thin film transistor using the foregoing PECVD method or RPCVD method, it has been hard to obtain a good quality amorphous semiconductor or a gate insulation film because the semiconductor layer and the gate insulation film should be fabricated under a high vacuum in a range of $10^{-2}$ Torr which causes generation of plasma in the process of forming a thin film that damages the lower surface of the thin film due to the high energy electrons and ions generated by the plasma, and causes to generate unnecessary decomposed particles.

Due to this, there is a limit in improving the characteristics of a thin film transistor.

Also the method has a problem of low productivity due to use of a high vacuum equipment that requires a long time in loading wafers and establishing a vacuum.

Further, in case a multilayer film is desired to be deposited continuously using this high vacuum thin film deposition method, this method has not only low processing speed but also difficulty in improving productivity and reducing the production cost due to a long deposition period of time required for the separate operation of the vacuum equipment.

SUMMARY OF THE INVENTION

The object of this invention is to provide a method for fabricating a thin film transistor which permits to obtain good quality films and improve the characteristics of the elements by depositing gate insulation film and amorphous semiconductor film with atmospheric pressure chemical vapor deposition method.

These and other objects and features of this invention can be achieved by providing a method for fabricating thin film transistor including processes for forming a gate electrode having sloped sides, forming a gate insulation layer on an exposed surface of the gate electrode, forming a semiconductor layer with atmospheric pressure chemical vapor deposition method such that the semiconductor layer has a pattern width wider than the pattern width of the gate electrode, and forming a source electrode and a drain electrode over the semiconductor layer and the substrate such that upper side of the semiconductor layer over the gate electrode can be exposed.

The foregoing method also permits forming of a gate insulation film with atmospheric pressure chemical vapor deposition method, and can further includes a process for forming a channel protection layer with atmospheric pressure chemical vapor deposition method after forming a gate insulation layer and a semiconductor layer with atmospheric pressure chemical vapor deposition method.

A method for fabricating an amorphous semiconductor film using atmospheric pressure chemical vapor deposition equipment includes a first step for mounting a substrate on a substrate supporter in a reaction furnace and producing vacuum inside of the reaction furnace by operating a pump, a second step for heating the substrate over 350 deg. C. by turning on a halogen lamp, and a third step for forming an amorphous semiconductor film on the substrate by injecting disilane into the reaction furnace after restoring the pressure inside of the reaction furnace back to atmospheric pressure by injecting purge gas into the reaction furnace.

The method for fabricating an amorphous semiconductor film can further includes a step for, to improve quality of the amorphous semiconductor film, injecting hydrogen gas ($H_2$) or nitrogen gas ($N_2$) into the reaction furnace after depositing the thin film and heat treating the substrate for over 15 minutes while maintaining the temperature of the substrate over 200 deg. C. and the pressure inside of the reaction furnace over 300 Torr.

The method for fabricating an amorphous semiconductor film can further includes steps for mounting the substrate having the amorphous semiconductor film deposited thereon on the substrate supporter inside of the reaction furnace, positioning the substrate supporter in a high frequency coil area, injecting hydrogen gas into the reaction furnace, and diffusing hydrogens into the amorphous semiconductor film by forming hydrogen plasma using the high frequency coil.

BRIEF DESCRIPTION OF THE DRAWINGS

FIGS. 11(a) to 11(c) show characteristics of a thin film transistor fabricated in accordance with a third embodiment of this invention wherein, FIG. 11(a) is transfer characteristic, FIG. 11(b) is a graph showing relation between drain voltage and drain current, and FIG. 11(c) is output characteristic of a drain electrode in case, after forming source/drain electrodes, they are subjected to a hydrogen embrittle treatment, respectively.

DETAILED DESCRIPTION OF THE INVENTION

Figure 1A:
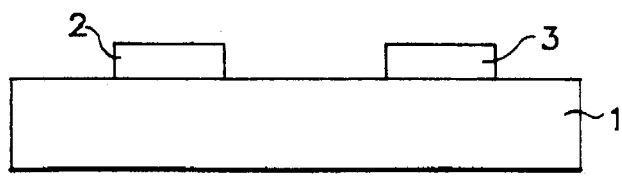
FIGS. 1(a) to 1(f) show processes for fabricating a conventional, staggered, hydrogen embrittled amorphous thin film transistor.
Figure 1B:
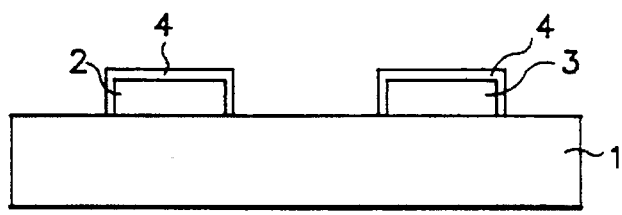
Figure 1C:
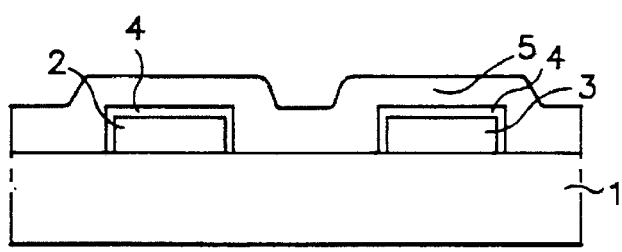
Figure 1D:
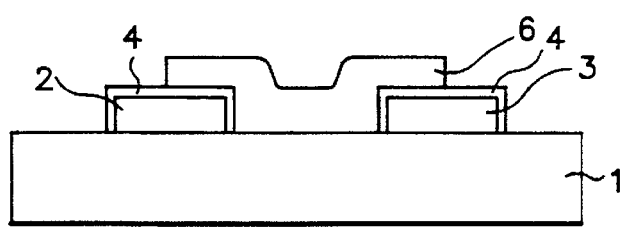
Figure 1E:
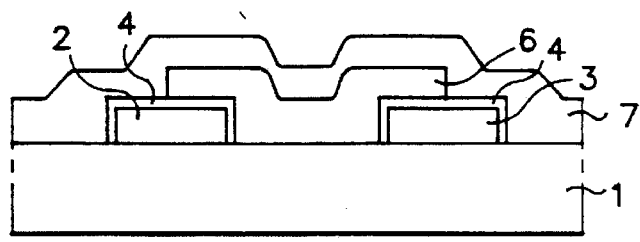
Figure 1F:
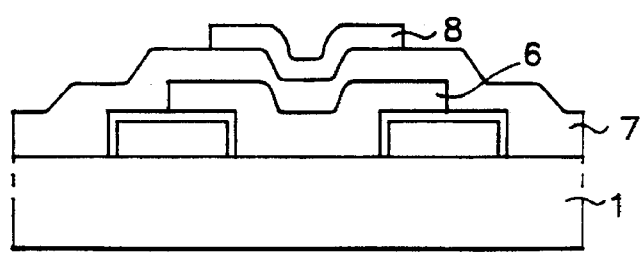
Figure 2A:
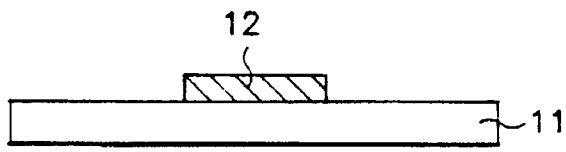
FIGS. 2(a) to 2(f) show processes for fabricating a conventional, hydrogen embrittled amorphous thin film transistor having single gate insulation film.
Figure 2B:
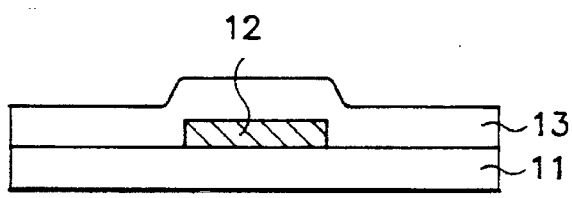
Figure 2C:
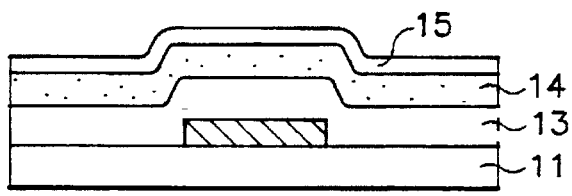
Figure 2D:
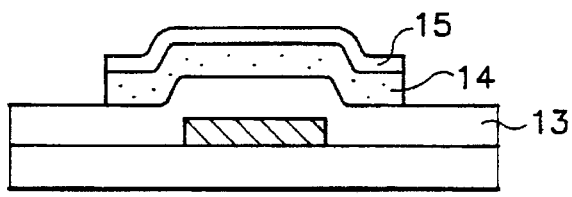
Figure 2E:
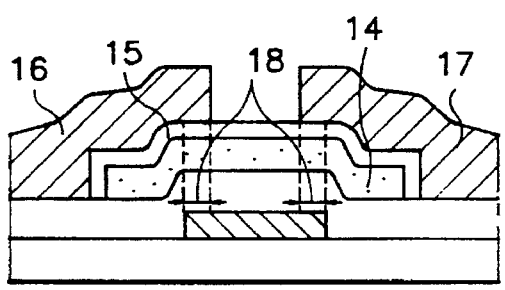
Figure 2F:
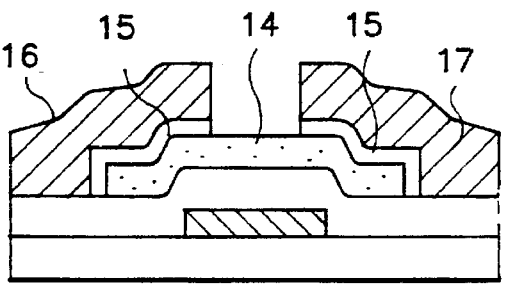
Figure 3:
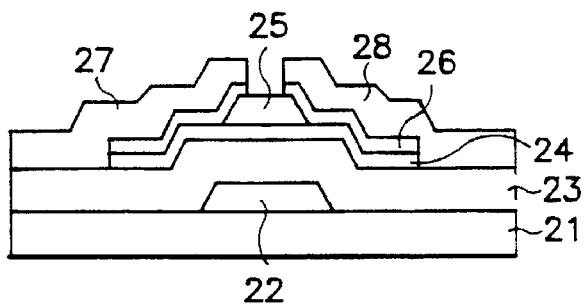
FIG. 3 is a section of a conventional hydrogen embrittled amorphous thin film transistor having a channel protection layer.
Figure 4A:
FIGS. 4(a) to 4(e) show processes for fabricating a conventional hydrogen embrittled amorphous thin film transistor of FIG. 3.
Figure 4B:
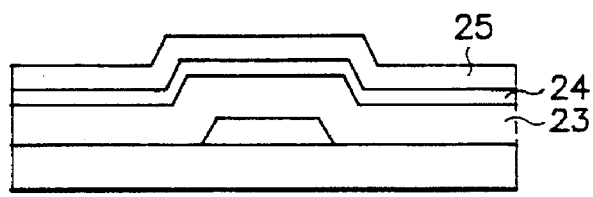
Figure 4C:
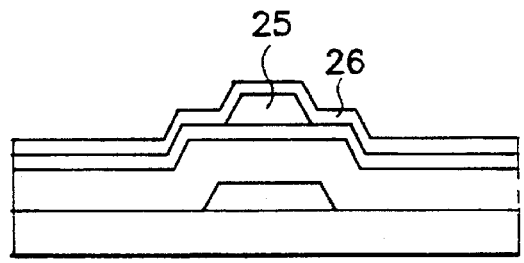
Figure 4D:
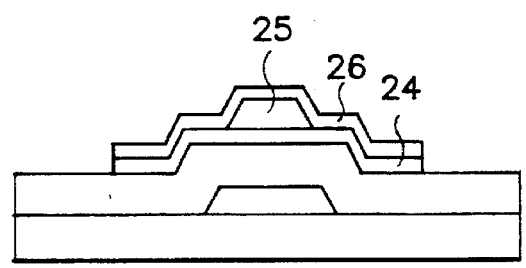
Figure 4E:
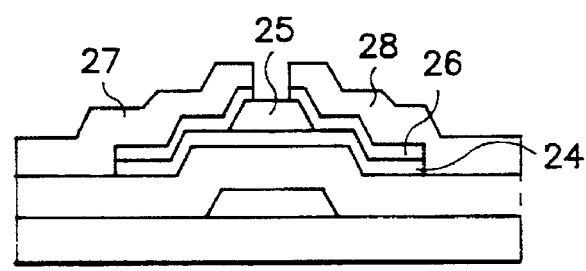
Figure 5:
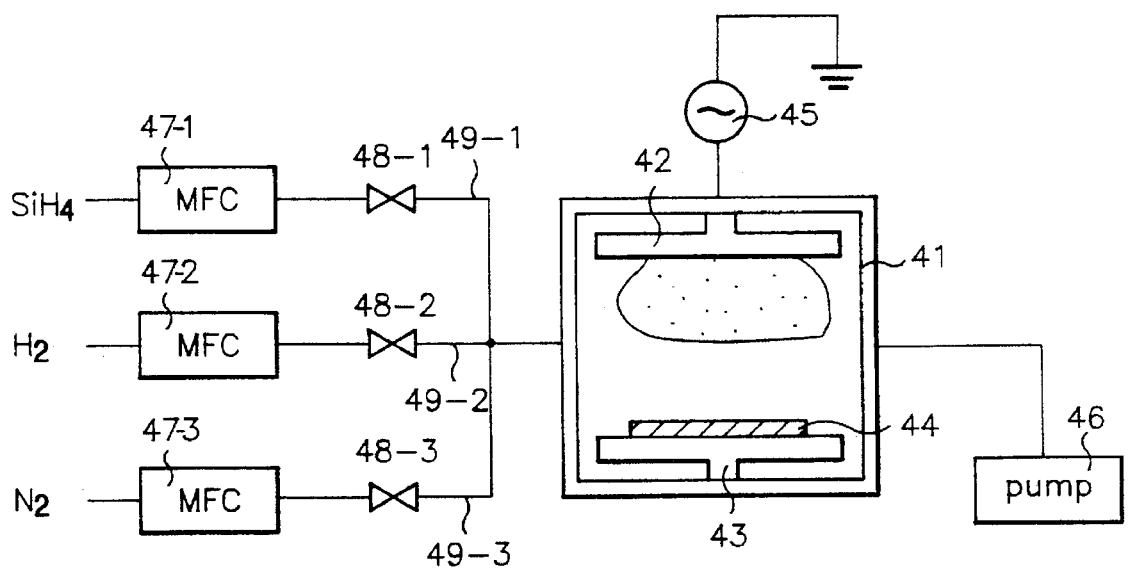
FIG. 5 is a schematic drawing of a PECVD equipment used for fabricating a conventional gate insulation film or amorphous semiconductor layer of a thin film transistor.
Figure 6:
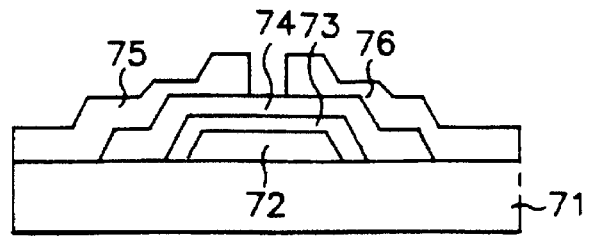
FIG. 6 is a section of a hydrogen embrittled amorphous thin film transistor having single gate insulation film formed with APCVD method in accordance with a first embodiment of this invention.

FIG. 6 is a section of a hydrogen embrittled amorphous thin film transistor having single gate insulation film in accordance with a first embodiment of this invention.

The thin film transistor in accordance with this invention includes a gate electrode 72 having sloped sides formed on a glass substrate 71 of insulation substrate, a gate insulation film 73 formed on an exposed surface of the gate electrode 72, a semiconductor layer 74 formed on the substrate 71 such that the semiconductor layer 74 is to cover the gate insulation layer 73 and to have a pattern width greater than the pattern width of the gate electrode 72, and a source electrode 75 and a drain electrode 76 formed over the semiconductor layer 74 and the substrate 71 such that the semiconductor layer 74 between the source and drain electrodes 75 and 76 over the gate electrode 72 can be exposed.

The fabrication method of a thin film transistor having the foregoing construction is to be explained hereinafter, referring to FIGS. 7(a) to 7(d).

Figure 7A:
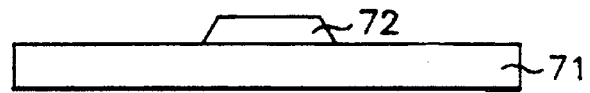
FIGS. 7(a) to 7(d) show processes for fabricating a hydrogen embrittled amorphous thin film transistor of FIG. 6.

As shown in FIG. 7(a), the gate electrode 72 is formed by depositing an anodic oxidisable metal layer of such as aluminum or tantalum with sputtering method on the glass substrate 71, and carrying out patterning of the metal layer with photoetching process.

Figure 7B:
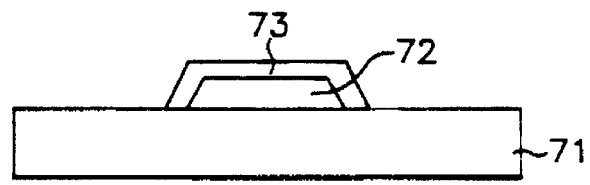

As shown in FIG. 7(b), by carrying out an anodic oxidation of the exposed surface of the gate electrode 72, a gate insulation film 73 of such as $Al_2O_3$ or $Ta_2O_5$ is formed.

In this time, portions of the gate electrode remained without having been anodic oxidized works as a gate electrode.

The gate insulation film can also be formed, instead of forming the gate insulation film through the foregoing anodic oxidation process, by forming the gate electrode 72 of non-anodic oxidizable metal, such as molybdenum or chromium and depositing gate insulation film 73 of SiOx or TaOx thereon successively.

Figure 7C:
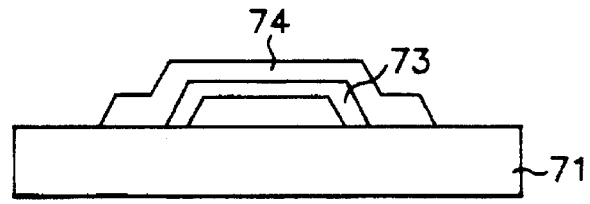
Figure 7D:
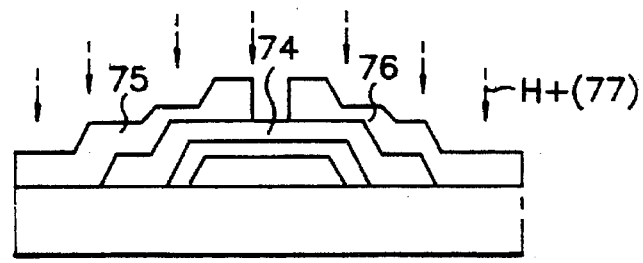

Then, the semiconductor layer is deposited using APCVD method, which is subjected to a patterning such that the semiconductor layer 74 has a wider pattern width than the pattern width of the gate electrode 72 and covers the gate insulation film 73 as shown in FIG. 7(c).

The semiconductor layer 74 is formed by depositing an a-Si film on the substrate 71 at a temperature of 380 to 430 deg.C under atmospheric pressure (400 to 760 Torr).

Gases used for forming the semiconductor layer 74 are gases of silane family, such as $Si_2H_6$, $Si_3H_8$ and $Si_4H_{10}$ etc. which are delivered to the surface of the substrate using helium(He) or hydrogen($H_2$), where the silane gas deposits due to thermal reaction with the surface of the substrate on the surface of the substrate forming the semiconductor layer 74 to a thickness of 300 to 1500 Angstroms.

After depositing the metal layer, a photoetching process is carried out to form the source electrode 75 and the drain electrode 76.

Consequently, the semiconductor layer 74 between the source and drain electrodes 75 and 76 over the gate electrode 72 can be exposed.

Finally, in order to reduce defects of the semiconductor layer 74 which is a channel portion of the thin film transistor element, by doping hydrogens 77 into the semiconductor layer 74 with hydrogen embrittle treatment at a temperature ranging between 150 deg.C to 250 deg.C, a thin film transistor in accordance with the first embodiment of this invention can be completed.

Figure 8:
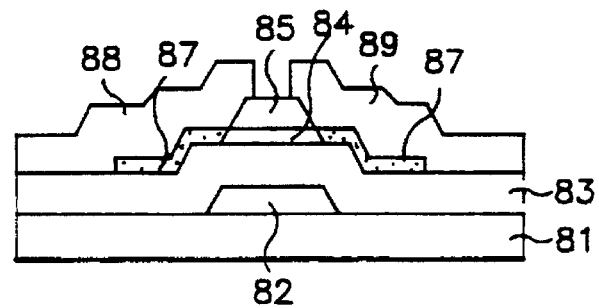
FIG. 8 is a section of a hydrogen embrittled amorphous thin film transistor having a channel protection layer formed with APCVD method in accordance with a second embodiment of thin invention.

FIG. 8 is a section of a thin film transistor in accordance with a second embodiment of this invention.

The thin film transistor in accordance with the second embodiment of this invention includes a gate electrode 82 formed on a glass substrate 81 of insulation substrate, an gate insulation film 83 formed on all over the substrate, a semiconductor layer 84 formed on the gate insulation film 83 over the gate electrode 82, impurity injected semiconductor layers 87 formed on the gate insulation film 85 adjoining both sides of the semiconductor layer 84, a channel protection layer 85 formed on the semiconductor layer 84, and a source electrode 88 and a drain electrode 89 formed over the channel protection layer 85, the impurity injected semiconductor layer 84 and the gate insulation layer 83 such that upper part of the channel protection layer 85 can be exposed.

The process for fabricating a thin film transistor having the foregoing construction is to be explained in detail hereinafter, referring to FIG. 9.

Figure 9A:
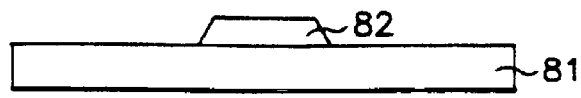
FIGS. 9(a) to 9(e) show processes for fabricating a hydrogen embrittled amorphous thin film transistor of FIG. 8.

As shown in FIG. 9(a), the gate electrode 82 is formed by depositing metal layer of such as chromium with sputtering method on the insulation substrate 81 and carrying out photoetching of the metal layer.

Figure 9B:
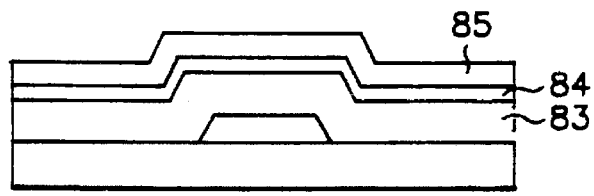

Then, as shown in FIG. 9(b), the gate insulation film 83, the semiconductor layer 84 and the channel protection layer 85 are formed with atmospheric pressure chemical vapor deposition method on all over the substrate 81, successively.

In this instant, for the gate insulation layer 83, an SiOx film or an SiNx film is used, wherein the SiOx film is deposited at a substrate 81 temperature of 350 to 450 deg.C. under atmospheric pressure (300 to 760 Torr) in gases having a ratio 10:1 of oxygen gas to $SiH_4$ gas, and the SiNx film is deposited at a temperature of 500 deg.C. of the substrate using $Si_2H_6+N_2H_4$ gas.

The semiconductor layer 84 is formed by depositing an amorphous semiconductor layer on the surface of the substrate at a substrate 81 temperature of 380 to 430 deg.C. under atmospheric pressure (300 to 760 Torr) due to the thermal reaction of silane family gases such as $SiH_4$, $Si_2H_6$ and $Si_3H_8$ mixed with hydrogen($E_2$) or helium(He) gas with the surface of the substrate.

After deposition of the semiconductor layer 84, to improve characteristics of the element, the element is subjected to a hydrogen embrittle treatment.

In the meantime, though the channel protection layer 85 also uses an SiNx film or an SiOx film the same with the case of the gate insulation film 83, the deposition is carried out at a lower temperature of below 300 deg.C. to prevent the hydrogens from escaping.

Figure 9C:
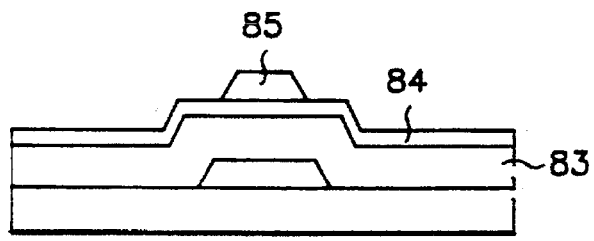

After depositing gate insulation layer 83, semiconductor layer 84 and the channel protection layer 85 in sequence as explained in the foregoing processes, the channel protection layer 85 is subjected to a patterning such that the channel protection layer 85 has a narrower pattern width than the pattern width of the gate electrode 82 as shown in FIG. 9(c).

Figure 9D:
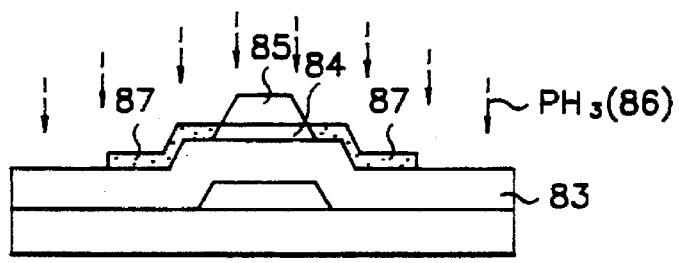
Figure 9E:
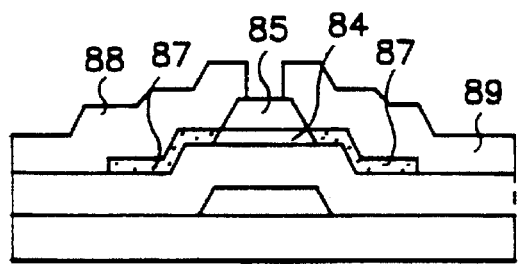

After carrying out patterning of the channel protection layer 85, upon injection of impurity ions into the semiconductor layer 84 with ion doping method in $PH_3$ gas using the channel protection layer 85 as a mask, impurity ion injected layers 87, resistive contact layers, can be formed on the gate insulation layer 83 adjoining both sides of the semiconductor layer 84 as shown in FIG. 9(d).

Then, by depositing single metal layer of such as aluminum or tantalum or a duplicate metal layer of such as Al/Cr or Ta/Cr and carrying out photoetching, the source electrode 88 and the drain electrode 89 can be formed over the channel protection layer 85, the impurity ion injection layers 87 and the gate insulation film 83 such that upper part of the channel protection layer 85 can be exposed.

FIGS. 10(a) to 10(e) show processes for fabricating a thin film transistor having single gate insulation film formed with APCVD method in accordance with a third embodiment of this invention.

Figure 10A:
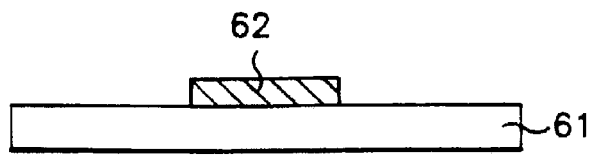
FIGS. 10(a) to 10(e) show processes for fabricating a hydrogen embrittled amorphous thin film transistor having single gate insulation film formed with APCVD method in accordance with a third embodiment of this invention.

As shown in FIG. 10(a), a gate electrode 62 is formed by depositing a first metal film using a sputter equipment on a cleaned glass substrate 61 and carrying out patterning of the first metal film with photoetching process using a prefixed pattern.

Figure 10B:
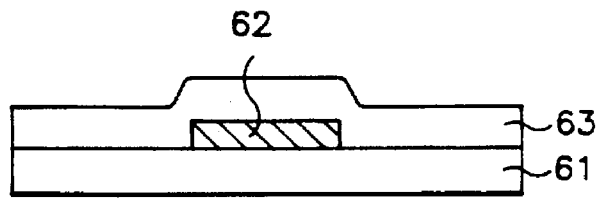

As shown in FIG. 10(b), an oxide film is formed with APCVD method on all over the substrate as a gate insulation film 63.

In this instant, the oxide film 63 is formed to a thickness of 2000 to 4000 Angstroms at a substrate temperature of 350 to 450 deg.C. under atmospheric pressure over 500 Torr in a mixture ratio of $O_2$ to $SiH_4$ of 20:1.

Figure 10C:
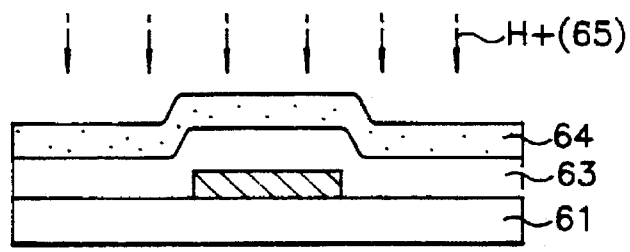

As shown in FIG. 10(c), an amorphous semiconductor film 64 is formed on the gate insulation film 63 at a substrate temperature of 380 to 430 deg.C. under atmospheric pressure of over 450 Torr.

In this instant, upon making silane gas, such as $Si_2H_6$, $Si_3H_8$ and $Si_4H_{10}$ etc. flow to the surface of the substrate using helium(He) or hydrogen($H_2$) gas, an amorphous silicon film 64 can be formed to a thickness of 300 to 1500 Angstroms due to thermal reaction with the surface of the substrate.

Upon doping of hydrogens 65 into the amorphous silicon film 64 formed in the foregoing process, a hydrogen embrittled amorphous silicon film can be formed.

The hydrogen embrittle treatment of the amorphous semiconductor film is carried out so that the hydrogen densities at the interface between the amorphous semiconductor film and the gate insulation film 63 thereunder and at the surface of the amorphous semiconductor film opposite to the interface are higher than the hydrogen density inside of the amorphous semiconductor film.

Figure 10D:
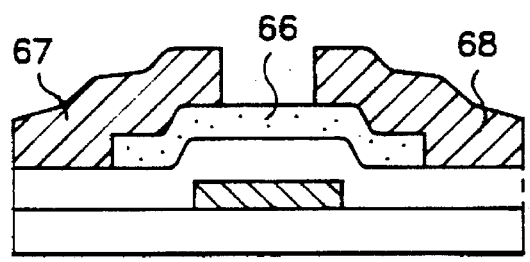

As shown in FIG. 10(d), a semiconductor layer 66 working as an active layer is formed by carrying out patterning of the hydrogen embrittled amorphous silicon layer with photoetching process such that the hydrogen embrittled amorphous silicon layer has a pattern width wider than or the same with the pattern width of the gate electrode 62.

Then, source and drain electrodes 67 and 68 are formed by depositing a second metal film using a sputter equipment on all over the substrate and carrying out patterning with photoetching process to a prefixed pattern.

Figure 10E:
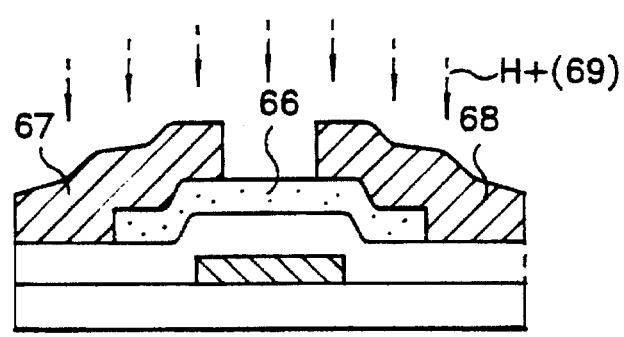

As shown in FIG. 10(e), the channel region between the source and drain electrodes 67 and 68 is subjected to a hydrogen embrittle treatment diffusing hydrogens($H^+$) into the channel region. The temperature of the hydrogen embrittle treatment is in a range of 150 to 250 deg.C.

According to the third embodiment, the hydrogen embrittle treatment of the amorphous silicon film can be carried out either after the deposition of the amorphous silicon film in the process shown in FIG. 10(c) or after forming the source/drain electrodes 67 and 68 in the process shown in FIG. 10(e).

Figure 11A:
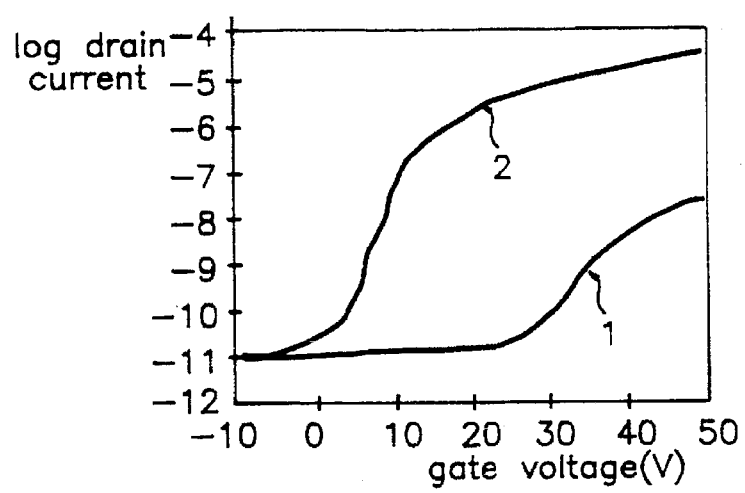
Figure 11B:
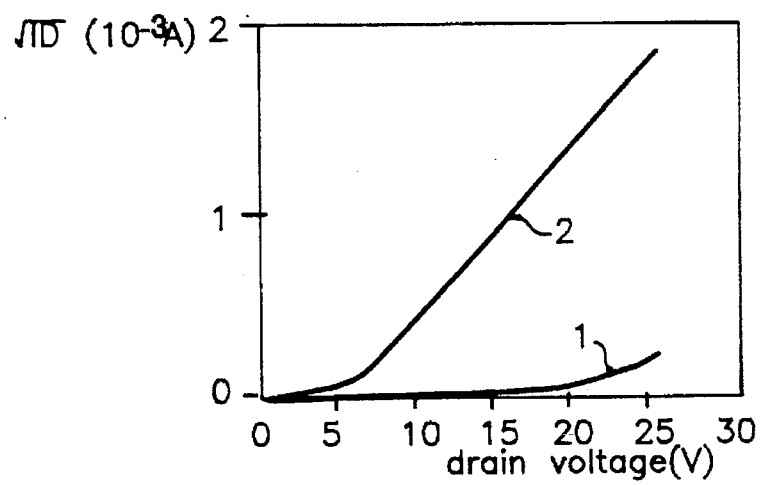
Figure 11C:
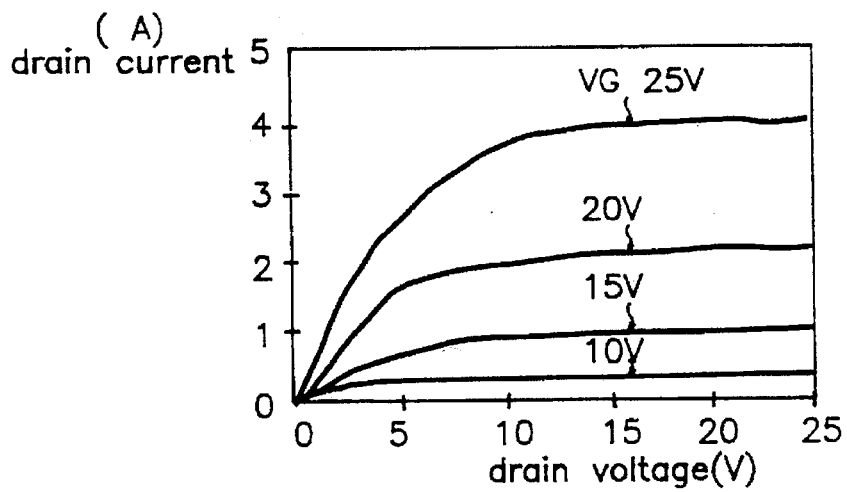

Shown in FIGS. 11(a) to 11(c) are characteristics of a thin film transistor fabricated in the foregoing processes.

FIG. 11(a) shows transfer characteristic 5 V of drain voltage, wherein the transfer characteristic before the hydrogen embrittle treatment after forming the source and drain electrodes 67 and 68 is shown in curve 1, and the transfer characteristic after the hydrogen embrittle treatment for 20 min. after forming the source and drain electrodes 67 and 68 is shown in curve 2.

It can be found that the transfer characteristic before the hydrogen embrittle treatment after forming the source/drain electrodes 67 and 68 has an off current of $10^{-1}$ A and current begins to flow when the gate voltage is 26 V.

And the curve of the transfer characteristic after the hydrogen embrittle treatment after forming the source and drain electrodes 67 and 68 can be found shifting to left. That is, the current begins to flow at about 5 V of the gate voltage.

We can take this due to the elimination of defects in the amorphous silicon film by the hydrogen embrittle treatment.

FIG. 11(b) shows relation between drain current (Id) and drain voltage, wherein curve 1 indicates a mobility prior to the hydrogen embrittle treatment after forming the source and drain electrodes and curve 2 indicates a mobility after the hydrogen embrittle treatment after forming the source and drain electrodes.

Referring to FIG. 11(b), it can be seen that the field effect mobility of the thin film transistor in accordance with this invention is to be more than 0.8 cm$^2$/V.sec, and a threshold voltage of below 5 V can be obtainable.

FIG. 11(c) shows output characteristic based of different voltage (V$_G$) after the hydrogen embrittle treatment after forming the source and drain electrodes, wherein current level at 15 V gate voltage shown to be about $10^{-6}$ A.

FIGS. 12(a) to 12(f) are sections showing processes for fabricating thin film transistor formed with APCVD method in accordance with a fourth embodiment of this invention.

The method for fabricating a thin film transistor in accordance with this invention is carried out by depositing an amorphous silicon film for an active layer with APCVD method.

Figure 12A:
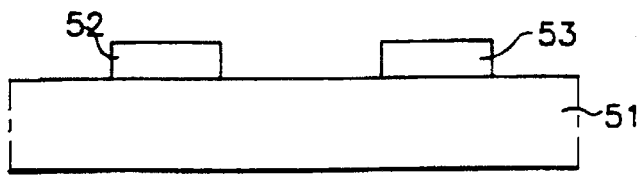
FIGS. 12(a) to 12(f) show processes for fabricating a staggered, hydrogen embrittled amorphous thin film transistor formed with APCVD method in accordance with a fourth embodiment of this invention.

As shown in FIG. 12(a), source/drain electrodes 52 and 53 are formed by depositing a first metal film to a thickness of 100 to 200 nm using a sputter equipment on a cleaned glass substrate 51 and carrying out patterning of the first metal film with photoetching process.

Figure 12B:
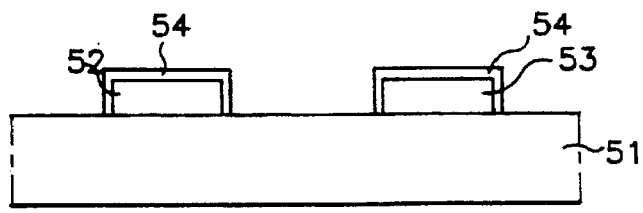

Then, as shown in FIG. 12(b), for making ohmic contact, an amorphous silicon(n$^+$ a-Si) film 54 doped with high density n$^+$ type impurities is deposited thereon to a thickness of about 50 nm with PECVD method which is subjected to a patterning such that an ohmic contact layer (impurity injected semiconductor layer) can be formed only on the exposed surface of the source/drain electrodes 52 and 53.

In this case, the n$^+$ type ohmic contact layer can also be formed by depositing an undoped amorphous silicon film and injecting n type ions such as phosphor into it.

Figure 12C:
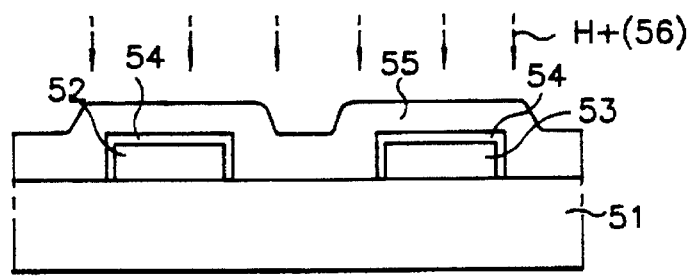

As shown in FIG. 12(c), a hydrogen embrittled amorphous silicon film is formed by depositing an amorphous silicon film 55 to a thickness of 50 to 200 nm at a temperature of 400 to 450 deg. C. with APCVD method on all over the surface and carrying out hydrogen embrittle treatment with doping of hydrogens 56 into the amorphous silicon film using plasma.

Therefore, the hydrogen embrittled amorphous silicon film has the densest hydrogen distribution at the surface thereof resulting to reduce lattice defects and charge trap level at the surface thereof.

Figure 12D:
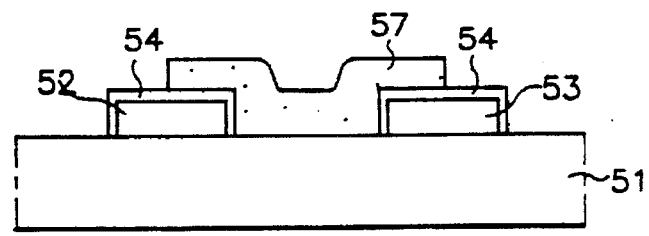

As shown in FIG. 12(d), a patterning is carried out with photoetching process such that the hydrogen embrittled amorphous silicon film can remain between the source/drain electrodes.

With this, a hydrogen embrittled amorphous silicon film can be formed as an active layer 57.

Figure 12E:
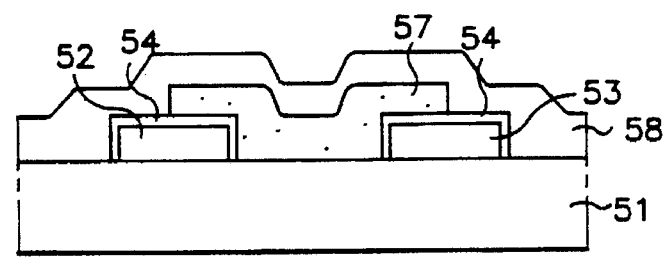

As shown in FIG. 12(e), either a silicon nitride (Si$_3$N$_4$) film to a thickness in a range of 200 to 300 nm at a temperature of 250 to 320 deg. C. using a PECVD equipment or a silicon oxide (SiO$_2$) film to a thickness in a range of 200 to 300 nm at a temperature of 350 to 450 deg. C. using an APCVD equipment, is formed on all over the surface as a gate insulation film.

Figure 12F:
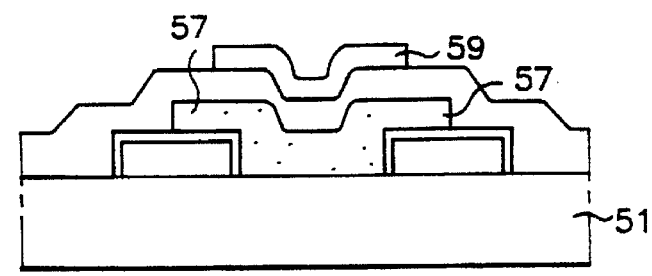

As shown in FIG. 12(f), a thin film transistor can finally be obtained by depositing a second metal film on the gate insulation film 58 and carrying out patterning with photoetching process such that the gate electrode 59 can be remained only on the gate insulation film 58 over the active layer 57.

According to the fourth embodiment, by increasing a hydrogen density at the interface between the hydrogen embrittled amorphous silicon film of an active layer and the gate insulation film, the lattice defects and the charge trap at the interface can be reduced enabling to obtain a mobility characteristic up to 1.0 cm$^2$/V.S.

Figure 13:
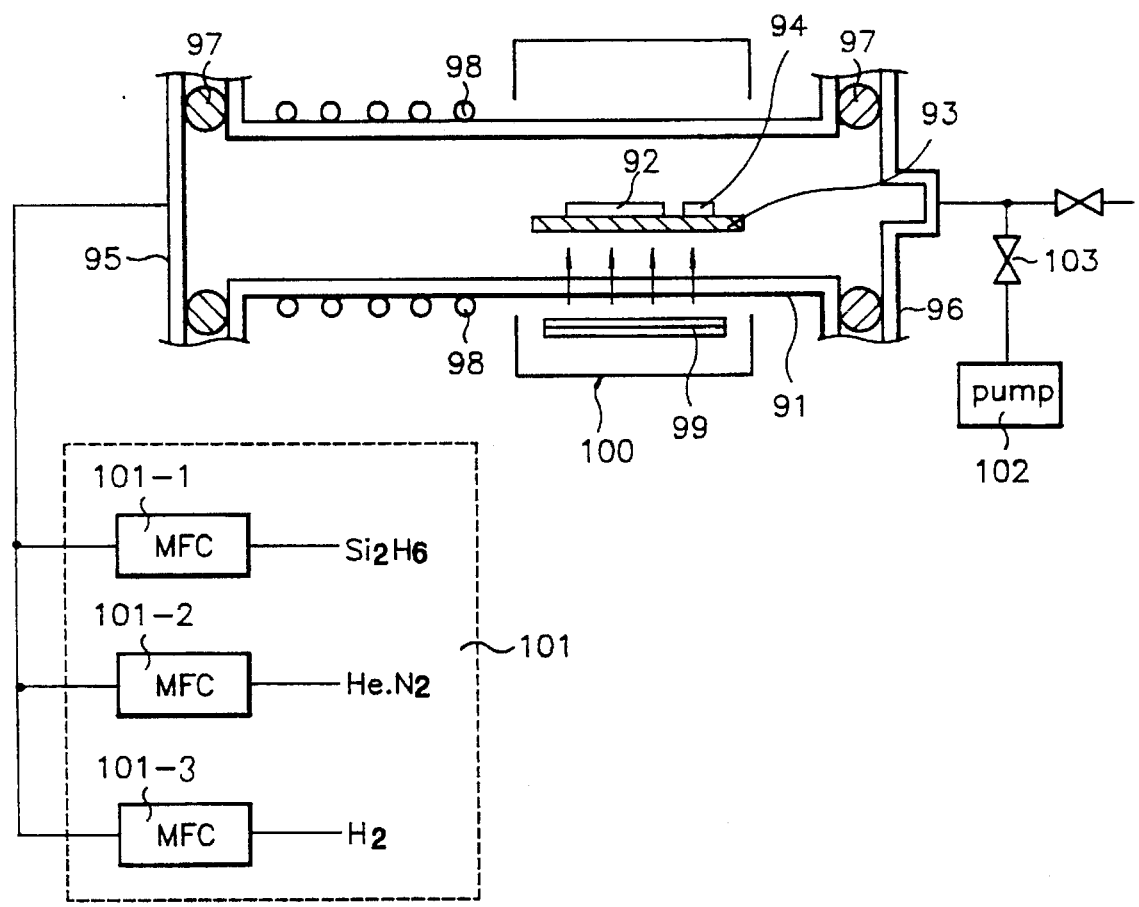
FIG. 13 is a schematic drawing of an APCVD equipment for carrying out the atmospheric pressure chemical vapor deposition method of this invention.

FIG. 13 is a schematic drawing of an APCVD equipment used for forming the gate insulation film and the amorphous semiconductor layer of the thin film transistor of this invention.

Referring to FIG. 13, the atmospheric pressure chemical vapor deposition (APCVD) equipment includes a reaction furnace 91 for making reactions for forming the amorphous semiconductor films, a substrate supporter 93 positioned inside of the reaction furnace 91 for supporting a substrate 92, a thermocouple 94 attached to the substrate supporter 93 for sensing a temperature of the substrate supporter 93, covers 95 and 96 mounted at a gas injection side and a gas discharge side of the reaction furnace 91, respectively for covering thereof respectively, sealing rings 97 inserted between the covers 95 and 96 and the reaction furnace 91 for sealing gases, a halogen lamp 99 mounted outside of the reaction furnace 91 positioned between middle and aft thereof for heating the substrate 92, a cooling device 100 mounted outside of the halogen lamp 99 for circulating water or gas for cooling the wall of the reaction furnace of the heat due to the halogen lamp 99, a gas injection part 101 for injecting reaction gases selectively as required into the reaction furnace 91, and a pump 102 connected to aft end of the reaction furnace 91 for reducing pressure therein or discharging gases therefrom.

The gas injection part 101 for injecting gases such as Si$_2$H$_6$, SiH$_4$, Si$_3$H$_8$, Si$_4$H$_{10}$, N$_2$, H$_2$ and He selectively as required into the reaction furnace 91 has a plurality of MFCs 101-1 to 101-3 for controlling the flow rate of the selected gases into the reaction furnace 91.

Reference number 103 represents a valve.

The processes for forming an amorphous semiconductor film on the substrate 93 using the foregoing APCVD equipment is, at first, to mount the substrate 92 on the substrate supporter 93 in the reaction furnace 91 with the thermocouple 94 and sealing the covers 95 and 96 at both the gas injection side and the gas discharge side with the sealing rings 97 to prevent leakage of gases.

Then, to raise temperature of the substrate 92, the halogen lamp 99 mounted outside of the reaction furnace 91 is turned on and heats the substrate 92 to a temperature of 350 deg. C. to 440 deg. C.

In this instant, while the temperature of the substrate 92 rises up to a temperature required for depositing an amorphous film, inside of the reaction furnace 92 is pumped out into vacuum.

When the temperature of the substrate 92 rises up to the temperature required for the deposition of the amorphous semiconductor film, the reaction furnace 91 is filled with purge gas of helium under the control of the MFC.

When the pressure inside of the reaction furnace 91 is built up over 400 Torr by the helium gas, disilane ($Si_2H_6$) gas is filled into the reaction furnace 91.

Accordingly, the disilane gas thermally decomposed at the surface of the substrate 92 due to the temperature thereof deposits on the surface thereof forming an amorphous semiconductor film thereon.

In this instant, in order to prevent the internal surface of the reaction furnace 91 of quartz tube from deposition of an amorphous silicon film, internal temperature of the reaction furnace 91 is cooled down below 350 deg. C. with cold air or compressed nitrogen.

When the amorphous silicon film has been deposited to a desired thickness, injection of the silane gas is stopped and heat treatment of the amorphous silicon film is carried out for more than 15 min. at a temperature between 200 deg. C. to 430 deg. C. under a pressure of over 300 Torr while injecting hydrogen or nitrogen into the reaction furnace 91.

And, in order to obtain a hydrogen embrittled amorphous silicon film, the amorphous silicon film is subjected to a heat treatment for more than 20 min. at a temperature of 180 deg. C. to 400 deg. C. in a hydrogen atmosphere under a pressure of over 400 Torr.

After the above heat treatment has been finished, hydrogen gas plasma is formed in vertical or horizontal to the substrate supporter 93 making the hydrogens injected into the surface of the amorphous silicon or semiconductor films, directly or indirectly.

In this instant, the density of hydrogen within the amorphous semiconductor film is made to be 1 atom % to 50 atom %.

After finishing hydrogen embrittle treatment as described in the foregoing process, the hydrogen embrittled amorphous silicon film is subjected to a heat treatment in hydrogen atmosphers to form a stable semiconductor film having an excellent film quality.

In the foregoing process, another kind of amorphous semiconductor film also can be formed by changing the gas injected into the reaction furnace.

This invention explained herein has following advantages.

The conventional method for fabricating an amorphous semiconductor film using PECVD method has disadvantages of damage to the substrate due to the plasma and deterioration of the quality of the film due to the particles, and delays in forming an amorphous semiconductor film at a high vacuum, whereas this invention permits to form an amorphous semiconductor film on a substrate by the temperature of the substrate through injecting reaction gases under atmospheric pressure without generation of plasma using an APCVD equipment.

Therefore, by prevention of damage to the substrate and unnecessary generation of particles due to the plasma ions, it is possible to obtain a good quality film.

Further, by injecting hydrogens into the reaction furnace and generating plasma while maintaining the temperature of the substrate between 180 deg. C. to 400 deg. C., a hydrogen embrittled amorphous semiconductor film can be obtained.

With these, the performance of an element can be improved.

Moreover, this invention can bring about an improvement of yield and a reduction of production cost because a thin film of good quality can be formed without generation of plasma under atmospheric pressure thermal equilibrium at about a pressure of 300 to 700 Torr using a simple APCVD equipment.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a thin film transistor comprising processes for:

forming a gate electrode having sloped sides on an insulating substrate;

forming a gate insulation film, a semiconductor layer and a channel protection layer successively using atmospheric pressure chemical vapor deposition on the entire insulating substrate;

patterning the channel protection layer such that the channel protection layer is to have a narrower width than the width of the gate electrode leaving the channel protection layer only on the semiconductor layer over the gate electrode;

forming an impurity injected semiconductor layer for making ohmic contacts on the gate insulation film by injecting impurity ions into the semiconductor layer; and, forming source and drain electrodes over the channel protection layer and the gate insulation film so that the upper surface of the channel protection layer can be exposed.

2. The method as claimed in claim 1, wherein either an SiOx film deposited at a substrate temperature of 350 to 450 deg. C. under a pressure ranging from 300 to 760 Torr or an SiNx film deposited at a substrate temperature of 500 deg. C. under a pressure ranging from 300 to 760 Torr, is used for the gate insulation film.

3. The method as claimed in claim 1, wherein the semiconductor layer is formed of an amorphous silicon layer and is deposited at a substrate temperature of 380 to 430 deg. C. under a pressure ranging from 300 to 760 Torr using one of $SiH_4$, $Si_2H_6$ and $Si_3H_8$ mixed with hydrogen ($H_2$) or helium (He) gas.

4. The method as claimed in claim 1, wherein the channel protection layer is formed of either an SiOx film or an SiNx film and deposited at a low temperature of below 300 deg. C.

5. The method as claimed in claim 1, wherein each of the source, and drain electrodes is formed of a single metal layer or double metal layers of Al/Cr or Ta/Cr.

6. The method as claimed in claim 1, wherein the impurity ion injected semiconductor layer is formed by injecting impurity ions into the semiconductor layer using $PH_3$ gas and using the channel protection layer as a mask.

* * * * *